United States Patent [19]

Koopman et al.

[11] Patent Number: 5,381,946
[45] Date of Patent: Jan. 17, 1995

[54] METHOD OF FORMING DIFFERING VOLUME SOLDER BUMPS

[75] Inventors: Nicholas G. Koopman, Raleigh; Glenn A. Rinne, Cary; Iwona Turlik, Raleigh; Edward K. Yung, Carrboro, all of N.C.

[73] Assignee: MCNC, Research Triangle Park, N.C.

[21] Appl. No.: 127,785

[22] Filed: Sep. 27, 1993

Related U.S. Application Data

[62] Division of Ser. No. 845,996, Mar. 4, 1992, Pat. No. 5,289,631.

[51] Int. Cl.$^6$ .............................................. H01L 21/60
[52] U.S. Cl. .............................. 228/254; 228/180.22; 228/56.3; 205/112; 205/123; 205/125
[58] Field of Search ................. 228/246, 254, 180.22, 228/56.3, 104; 205/112, 123, 125; 29/874, 885

[56] References Cited

U.S. PATENT DOCUMENTS

| | | |
|---|---|---|
| 3,663,184 | 5/1972 | Wood et al. |
| 3,839,727 | 10/1974 | Herdzik et al. |
| 4,042,954 | 8/1977 | Harris. |
| 4,237,607 | 12/1980 | Ohno. |
| 4,273,859 | 6/1981 | Mones et al. |
| 4,293,637 | 10/1981 | Hatada et al. |
| 4,661,375 | 4/1987 | Thomas ............................. 427/89 |
| 4,836,435 | 6/1989 | Napp et al. |
| 4,878,611 | 11/1989 | LoVasco et al. |
| 4,950,623 | 8/1990 | Dishon. |
| 4,975,079 | 12/1990 | Beaman et al. |
| 4,975,765 | 12/1990 | Ackermann et al. |
| 5,006,792 | 4/1991 | Malhi et al. |
| 5,007,163 | 4/1991 | Pope et al. |
| 5,065,227 | 11/1991 | Frankeny et al. |
| 5,073,117 | 12/1991 | Malhi et al. |
| 5,088,190 | 2/1992 | Malhi et al. |
| 5,108,027 | 4/1992 | Warner et al. |

FOREIGN PATENT DOCUMENTS

| | | |
|---|---|---|
| 0085974 | 8/1983 | European Pat. Off. |
| 55-111127 | 8/1980 | Japan |
| 55-156339 | 12/1980 | Japan |
| 56-49543 | 5/1981 | Japan |
| 56-66057 | 6/1981 | Japan |

(List continued on next page.)

OTHER PUBLICATIONS

*Decal Solder Transfer,* R. J. Herdzik et al., IBM Technical Disclosure Bulletin, vol. 22, No. 3, Aug. 1979.

(List continued on next page.)

*Primary Examiner*—Samuel M. Heinrich
*Attorney, Agent, or Firm*—Bell, Seltzer, Park & Gibson

[57] ABSTRACT

An integrated circuit chip having solder bumps thereon may be tested using a temporary substrate having substrate pads corresponding to locations of the input/output pads on the chip and having a sacrificial conductor layer on the temporary substrate pads. The solder bumps are placed adjacent the corresponding sacrificial metal layer and heated to form an electrical and mechanical connection between the chip and the temporary substrate. The chip is then tested and/or burned-in on the temporary substrate. After testing/burn-in, the sacrificial metal layer is dissolved into the solder bumps by heating. The integrated circuit chip, including a solder bump having the dissolved sacrificial metal layer therein, may be easily removed from the temporary substrate. Solder bumps may also be formed on the temporary substrate and transferred to unbumped chips. Solder bumps with different characteristics may be formed by varying the current-time product to each individual pad of the temporary substrate during a plating operation.

8 Claims, 7 Drawing Sheets

FOREIGN PATENT DOCUMENTS

| | | |
|---|---|---|
| 57-7147 | 1/1982 | Japan . |
| 57-11141 | 3/1982 | Japan . |
| 57-73952 | 5/1982 | Japan . |
| 57-197838 | 12/1982 | Japan . |
| 58-219749 | 12/1983 | Japan . |
| 59-117135 | 7/1984 | Japan . |
| 59-154041 | 9/1984 | Japan . |
| 59-188147 | 10/1984 | Japan . |
| 60-136338 | 7/1985 | Japan . |
| 60-180146 | 9/1985 | Japan . |
| 60-180147 | 9/1985 | Japan . |
| 60-198750 | 10/1985 | Japan . |
| 61-194744 | 8/1986 | Japan . |
| 63-58945 | 3/1988 | Japan . |
| 2247565 | 3/1992 | United Kingdom . |

OTHER PUBLICATIONS

*Solder Rework Technique*, R. J. Herdzik et al., IBM Technical Disclosure Bulletin, vol. 21, No. 12, May 1979.

*Method to Change Solder Composition of Chip*, R. J. Herdzik et al., IBM Technical Disclosure Bulletin, vol. 22, No. 3, Aug. 1979.

*Solder Volume Optimization*, R. J. Herdzik et al., IBM Technical Disclosure Bulletin, vol. 21, No. 12, May 1979.

*Terminal Metallurgy System For Semiconductor Devices*, P. P. Castrucci et al., IBM Technical Disclosure Bulletin, vol. 9, No. 12, May 1967.

METHOD OF FORMING DIFFERING VOLUME SOLDER BUMPS

This application is a division of application Ser. No. 07/845,996, filed Mar. 4, 1992, now U.S. Pat. No. 5,289,631.

FIELD OF THE INVENTION

This invention relates to processing of integrated circuit chips after fabrication to incorporate the integrated circuit chips into a next level of packaging such as a circuit board or substrate, and more particularly to a method and apparatus for processing solder bump or "C4" ("controlled collapse circuit connection") chips after their fabrication.

BACKGROUND OF THE INVENTION

Integrated circuit chips are typically manufactured by forming the active devices for many chips on a single wafer of semiconductor material. The wafer is metallized to form the required interconnections among the active devices. The wafer is then diced into individual chips. The chips are mounted on a next level of packaging such as a printed circuit board, a multilayer ceramic (MLC) substrate, or other substrate, to form a single chip or multi-chip module.

Microelectronic systems have required ever increasing density of input/output (I/O) connections between an integrated circuit chip and its next level packaging. Accordingly, the art has increasingly turned to an interconnection technology which uses solder bumps or solder balls to electrically and mechanically connect the chip I/O pads to pads on a next level of packaging. This interconnection technology is also known as "controlled collapse chip connections" ("C-4") or "flip chip" technology. This technology has also been used in environments which do not require high I/O densities.

Many techniques have been heretofore described for forming solder bumps on an integrated circuit chip. For example, U.S. Pat. No. 4,950,623 to Dishon entitled *Method of Building Solder Bumps*, assigned to the assignee of the present invention, the disclosure of which is hereby incorporated herein by reference, describes a method of forming a solder bump on an underbump metallurgy by depositing a layer of solder-soluble metal on the underbump metallurgy so as to cover the underbump metallurgy. A layer of solidified solder is then coated on the solder soluble metal. The solder is then heated until the layer of solder melts and the solder-soluble metal dissolves in the melted solder. The surface tension of the melted solder draws the solder and dissolves soluble metal away from the nonwettable passivation layer which surrounds the underbump metallurgy, to form a spheroidal solder bump.

Another solder bump fabrication technique is described in Japanese Patent No. 55-111127 by Saga et al., published on Aug. 27, 1980 and entitled *Method of Building Solder Bumps*. This patent describes a two-step melting process for forming solder bumps. In a first low temperature heating step, an under-bump metallurgy layer is dissolved. Then, the photoresist which was used to define the underbump metallurgy is removed and the chip is tested in an unspecified manner. Then, a high temperature heating step is performed to form a hemispherical solder bump.

Other techniques for forming solder bumps involve transfer from a decal chip onto a device chip or a multilayer ceramic structure. See, for example, IBM Technical Disclosure Bulletins Vol. 22, No.3, page 996, August 1979 entitled *Decaled Solder Transfer*; Vol. 21, No.12, May 1979 page 4835 entitled *Solder Rework Technique*; Vol.21, No.12, May 1979 page 4834 entitled *Solder Volume Optimization*; and Vol. 22, No. 3, August 1979, page 995 entitled *Method to Change Solder Composition of Chip*.

In the manufacture of chips, some testing is typically performed at the wafer level. However, it is difficult to perform exhaustive tests of the chips at the wafer level. Similarly, some tests are performed at the module level after the chip is incorporated into the next level package. However, detection of failure at this level often requires scrapping the entire package or may require expensive rework of the package. Accordingly, it is highly desirable to perform testing of the chip after it has been diced from the wafer but before it is mounted on a next level package. Testing, as used herein, includes any and all operations, electrical or otherwise, which are typically performed on integrated circuits. Examples of such operations include parametric measurements, verification of functionality, erasure of Erasable Programmable Read-Only Memories (EPROM), programming of Programmable Logic Devices (PLDS) and power-on burn-in. Similarly, it is highly desirable to perform a "burn-in" at elevated temperatures (e.g. 160° C.) and for long times (e.g. hundreds of hours) to identify early failures.

Unfortunately, it is difficult to perform "burn-in and test" on chips having solder bumps thereon. These chips are difficult to probe due to the very high density and close spacing of the solder bumps. Moreover, if the solder bumps are probed and simultaneously burned-in, distortion and squashing of the solder bumps typically occurs, which renders the chips unusable or requires expensive rework. Chip burn-in may also damage the next level package.

Techniques have recently been developed to allow test and burn-in of C-4 chips. For example, U.S. Pat. Nos. 5,006,792 and 5,073,117 both to Malhi et al. and both entitled *Flip-Chip Test Socket Adaptor and Method*, describe a test socket which includes a plurality of cantilever beams for making electrical contact to a bare chip. The cantilevers are designed to deflect and compensate for variations in solder bumps on the bare chips. Unfortunately, since solder bump connections typically are formed in an array over the entire face of an integrated circuit chip, it is difficult to form cantilever beam connections to all of the solder bumps. Moreover, these beams may squash the solder bumps during burn-in and test.

Another electrical connector for contacting C-4 chips during burn-in and test is described in U.S. Pat. No. 4,975,079 to Beaman et al. entitled *Connector Assembly for Chip Testing*. The connector includes a plurality of rigid conductors embedded therein, and a concave opening aligned with an end of each conductor so that each concave opening exposes the conductor and mates with the contact areas on the chip. Unfortunately, such a connector may also unduly stress the solder balls during burn-in and test.

Another technique for burn-in and test of C-4 chips is described in U.S. Pat. No. 5,065,227 to Frankeny et al. entitled *Integrated Circuit Packaging Using Flexible Substrate*. An integrated circuit chip having solder balls thereon is mounted on a substrate having input/output lines which extend outward from the integrated circuit footprint to an area on the substrate which is accessible. The integrated circuit chip can thereby be tested prior to mounting on its ultimate carrier. Once tested, the chip and the substrate are excised from the roll of substrate material. This excised, pretested package, which includes both the chip and the flexible substrate, can be mounted directly onto the ultimate carrier. Unfortunately, the flexible substrate is an additional package level which may impact the reliability of the overall package, and limits the density and performance attainable.

Finally, another technique for testing C-4 chips is described in U.S. Pat. No. 5,007,163 to Pope et al. entitled Non-Destructure (sic) *Method of Performing Electrical Burn-In Testing of Semiconductor Chips*. An electrically conductive, liquid eutectic joint is formed at room temperature with low pressure between electrical terminals on a chip and a circuitized substrate. The eutectic joint remains liquid at test temperatures, while enabling test completion. At the end thereof, chips and pads are separated and any eutectic material residue thereon is removed. Unfortunately, the liquid burn-in/test interconnections may be unreliable and the liquid eutectic joint may be unstable. Moreover, the liquid eutectic may alloy with the solder bumps and thus may be difficult to remove.

As the above survey indicates, the art has heretofore not developed a satisfactory method for performing "burn-in and test" of C-4 chips.

SUMMARY OF THE INVENTION

It is therefore an object of the present invention to provide an improved method and apparatus for burn-in and test of solder bump or C-4 chips.

It is yet another object of the present invention to provide a method and apparatus for burn-in and test of solder bump chips which does not adversely impact the reliability or integrity of the solder bumps.

These and other objects are attained according to the present invention, by providing a temporary substrate having temporary substrate pads at one face thereof, at locations corresponding to the input/output pads on an integrated circuit chip to be tested, and having a solid phase sacrificial conductor (preferably metal) layer on the temporary substrate pads. The solid phase sacrificial conductor layer is in solid phase at room temperature and also at typical burn-in temperatures.

An integrated circuit chip is placed adjacent the temporary substrate, with the input/output pads thereof adjacent the sacrificial layer and a solder bump between each corresponding input/output pad and the sacrificial layer. The solder bumps are then heated to form a solid phase mechanical connection and an electrical connection between the input/output pad on the chip and the corresponding temporary substrate pad on the temporary substrate.

The integrated circuit chip is then tested and/or burned-in on the test substrate. Preferably, the temporary substrate pads, and the external electrical connections therefore, are insulated from one another so that an individual pad can be electrically accessed, independent of the other pads. Individual access of pads facilities testing of the integrated circuit chip.

After testing/burn-in, the sacrificial metal layer is dissolved into the solder bumps by heating at elevated temperature above the burn-in temperature. The integrated circuit chip, including the solder bump having the dissolved sacrificial metal layer therein, may then be easily removed from the temporary substrate. The integrated circuit chip may thereby be tested on the temporary substrate and removed from the temporary substrate without impacting the integrity of the integrated circuit chip.

In one embodiment of the present invention the integrated circuit chip has solder bumps formed on the input/output pads thereof using well known techniques. The solder bumps are then placed on the sacrificial metal layer of the temporary substrate pads, and heated to form a solid phase mechanical connection between the chip input/output pads and the temporary substrate pads. The solder bumps are formed of a material which is nonwettable to the pads on the temporary substrate, and the sacrificial metal layer is preferably formed of a material which is dissolvable into the solder bumps and which is wettable to and can dissolve into the solder bumps, and which is adherable to the temporary substrate pads. The solder bumps wet to the sacrificial metal layer upon heating. However, upon dissolving the sacrificial metal layer into the solder bumps, the solder bumps no longer wet to the underlying temporary substrate pad, so that the tested integrated circuit chip may be easily removed from the temporary substrate without impacting the solder volume.

The temporary substrate may also be used to form solder bumps to be transferred to an unbumped chip. In particular, the sacrificial metal layer may be formed on the test pads of the temporary substrate and then the solder bumps may be formed on the sacrificial metal layer. An unbumped chip with solder wettable pads may then be placed on the solder bumps and heated to form an electrical and mechanical connection between the solder bumps and the input/output pads of the chip. Testing, dissolving the sacrificial metal layer into the solder bumps, and removing the integrated circuit chip, may proceed as heretofore described. Upon removal, the solder bumps are transferred from the temporary substrate onto the input/output pads of the integrated circuit chips.

When the solder bumps are actually formed on the test substrate and then transferred to unbumped chips after testing/burn-in, the solder bumps may be formed with various desirable characteristics which were heretofore difficult to obtain. Most applications require uniform composition, size, and volume for all of the bumps on the device. For this, any of the conventional bump forming methods may be used, such as evaporation or electroplating. There are special applications, however, where a non-uniform array of solder bumps is desired.

In particular, it is known to be highly desirable to provide different volumes of solder bumps on a single chip. For example, power and signal pads may be different sizes or abnormally large pads may be used for thermal transfer. It has heretofore not been possible to easily form differing volumes of solder on a single chip. Solder plating on the temporary substrate offers unique advantages. It is known that differing current-time products delivered to each chip input/output pad can plate differing amounts of solder. However, since the input/output pads of a chip are not individually accessible, it has been heretofore difficult to provide different current-time products to each pad during plating.

The temporary substrate of the present invention includes electrically isolated connections to each pad thereon to allow independent testing. Accordingly, the temporary substrate may be placed in a solder plating solution and differing current-time products may be applied to each pad thereon, to thereby form different volumes of solder bumps on the different pads. Then, the solder bumps may be transferred to the integrated circuit chip to thereby form an integrated circuit chip having different volume solder bumps thereon.

The temporary substrate of the present invention allows testing/burn-in of C-4 chips without impacting the reliability of the solder bumps thereon. Moreover, the substrate itself may be used as a vehicle for actually forming solder bumps and transferring the solder bumps to chips. When used as such a vehicle, unique solder bump characteristics, such as different solder bump volumes may be readily obtained. Improved testing of solder bump chips is thereby provided, as are improved techniques and systems for placing solder bumps on integrated circuit chips.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather this embodiment is provided so that this disclosure will be thorough and complete, and will fully convey the scope of the invention to those skilled in the art. Like numbers refer to like elements throughout.

Figure 1A:
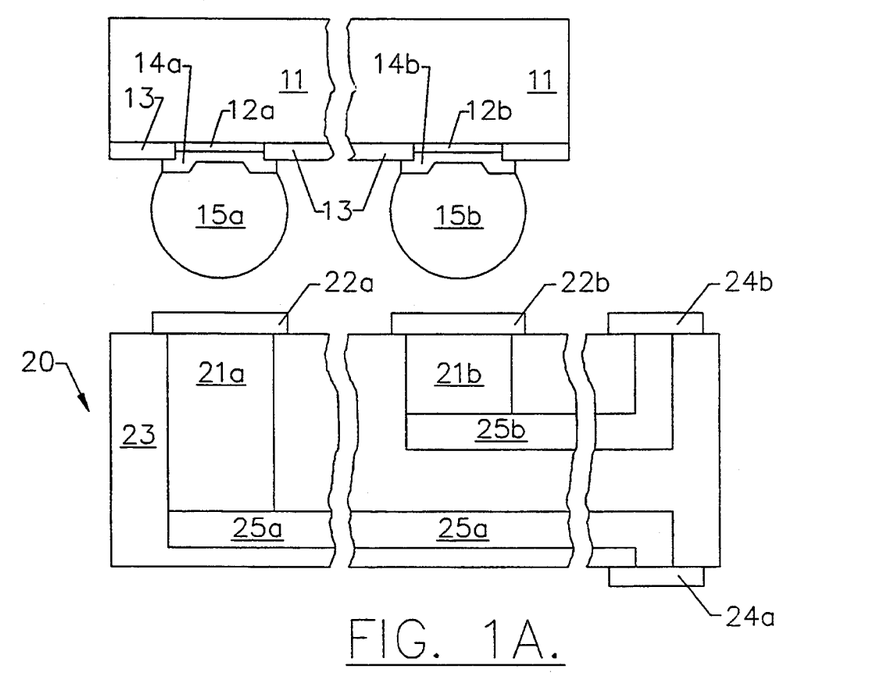
FIGS. 1A-1E are cross-sectional views of the operational steps in a first method for testing an integrated circuit chip according to the present invention.

Referring now to FIGS. 1A-1E, a method for testing an integrated circuit chip according to the present invention is illustrated. As shown in FIG. 1A, integrated circuit chip 11 is typically formed of silicon or other semiconductor material, and typically includes a large number of active devices therein (not shown). External connections to the chip are provided by chip input/output (I/O) pads 12a, 12b. As used herein, "chip I/O pads" refers to any external input/output connection means on the chip, and may include microsockets or other means. The pads may include a single conductor layer or multiple conductor layers. Pads 12 are typically insulated from one another by a passivation layer 13, which may be silicon dioxide or other insulators. It will be understood by those having skill in the art that a typical chip may have one hundred or more I/O pads on one face thereof to provide high density interconnections.

In order to enhance the formation of solder bumps on the chip I/O pads 12, each chip I/O pad typically includes underbump metallurgy 14a, 14b thereon. The underbump metallurgy is typically formed of layers of chromium, copper and gold, although other forms of underbump metallurgy are well known to those having skill in the art. As also shown in FIG. 1A, a solder bump 15a, 15b is formed on underbump metallurgy 14a, 14b respectively, using techniques well known to those having skill in the art, such as electroplating or evaporation. Accordingly, as described, integrated circuit chip 11 is a conventional C-4 chip having solder bumps thereon.

As also shown on FIG. 1A, a temporary substrate 20 is also provided. The temporary substrate 20 may be fabricated from many common substrate materials such as silicon, alumina ($AL_2O_3$), gallium arsenide (GaAs), sapphire, other ceramics or other well known materials used for printed circuit boards or packaging substrates. Temporary substrate 20 includes temporary substrate pads 21a-21b at locations corresponding to the I/O pads 12a, 12b of the integrated circuit chip 11. As used herein, "temporary substrate pads" refers to any external connection means on the substrate, and may include microsockets or other means. The pads may include a single conductor layer or multiple conductor layers. When substrate 20 is formed of alumina ceramic, temporary substrate pads 21 may be molybdenum or tungsten. The exposed surfaces of temporary substrate pads 21 are formed of a material which is nonwettable to the solder bump 15. If the substrate wiring is wettable (such as copper or nickel), it is capped with a non-wettable barrier layer (such as chromium or molybdenum.)

As also shown in FIG. 1A, temporary substrate 20 also includes external connection pads 24a, 24b and interconnection layers 25a, 25b for connecting a respective temporary substrate pad 21 to a respective external connection pad 24. The external connection pads 24 may be MoNiAu or WNiAu, and interconnection layers 25 may be molybdenum or tungsten, however other materials may also be used. The pads may include a single conductor layer or multiple conductor layers. As used herein, "external connection pads" refer to any external connection means on the substrate, and may include microsockets or other means. The external connection pads, interconnection layers and temporary substrate pads are insulated from one another to form a plurality of independent electrical connection paths between the chip I/O pads and the external connection pads. Individual temporary substrate pads may thereby be electrically accessed.

Still referring to FIG. 1A, a sacrificial conductor layer 22a, 22b is formed on each of the temporary substrate pads 21a, 21b. As described below, the sacrificial layer preferably possesses the following characteristics: It is solid phase at room temperature and at the desired burn-in temperature. It is also wettable by solder 15 so that molten solder can adhere to the sacrificial layer 22 without fully dissolving the layer 22 in the solder during joining. However, the sacrificial conductor layer is also soluble enough in solder so that, upon exposure to an appropriate later heat cycle, the sacrificial layer 22 can fully dissolve into the solder, allowing the solder to dewet from the underlying nonsolderable temporary substrate pads 21. The sacrificial layer 22 is also adherent to the temporary substrate pads 21.

A number of metals have been found to satisfy the above requirements for the sacrificial layer. In particular, when standard lead-tin solder (i.e. 95% lead and 5% tin-95/5PbSn) is used, and when temporary substrate pads 21 are formed of molybdenum or tungsten, it has been found that sacrificial conductor layer 22 may be formed of about 200 Å of copper. Other thicknesses may be used, depending upon the exact heating conditions to which the layer will be exposed. It has also been found that palladium, silver, gold or alloys thereof and copper alloys may also be used for sacrificial layer 22. Other materials or combinations thereof may also be used. In addition, other materials may be added to the sacrificial layer to add these materials to the solder bump.

Figure 1B:
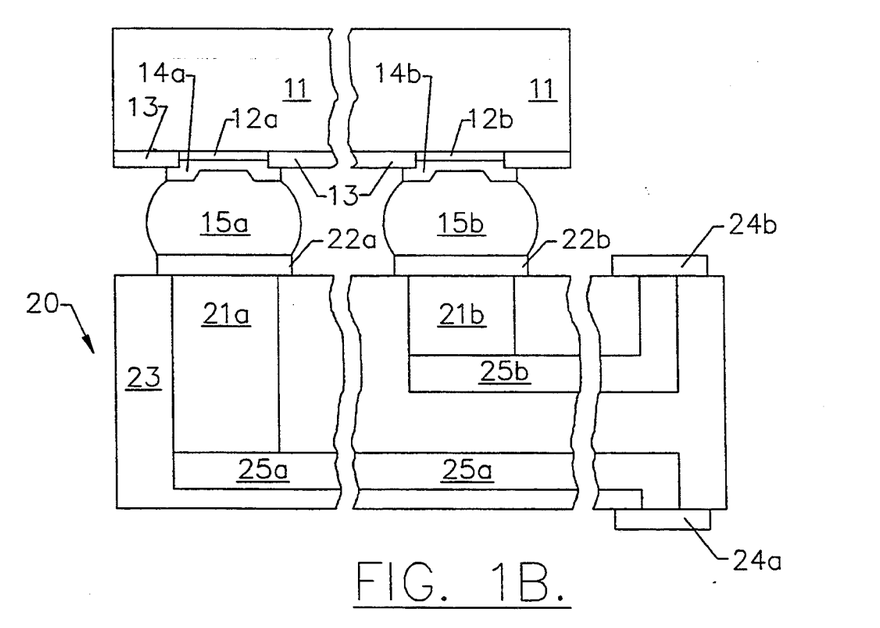

As shown in FIG. 1A, in order to test the integrated circuit chip 11, the chip is moved adjacent temporary substrate 20, with the chip I/O pads 12 adjacent the sacrificial layer 22. Then, as shown in FIG. 1B, the solder bumps 15 are moved into contact with temporary conductor layer 22 and the solder bumps are heated to allow the bumps to wet onto sacrificial layer 22 without fully dissolving the sacrificial layer 22 into solder bumps 15. Accordingly, mechanical and electrical connections between the chip 11 and the temporary substrate 20 are produced. In order to join the 95/5PbSn solder bump 15 to a sacrificial layer of 200 Å copper, the solder may be heated to 350° C. for 1 minute above liquidus using a standard heating profile. Flux may be used according to standard processes, and the flux may be cleaned using standard processes. Alternatively, fluxless soldering processes may be used. It will be understood by those having skill in the art that although some leaching from sacrificial layer 22 into solder bumps 15 may occur, the sacrificial layer 22 does not fully dissolve during the initial joining.

Figure 1C:
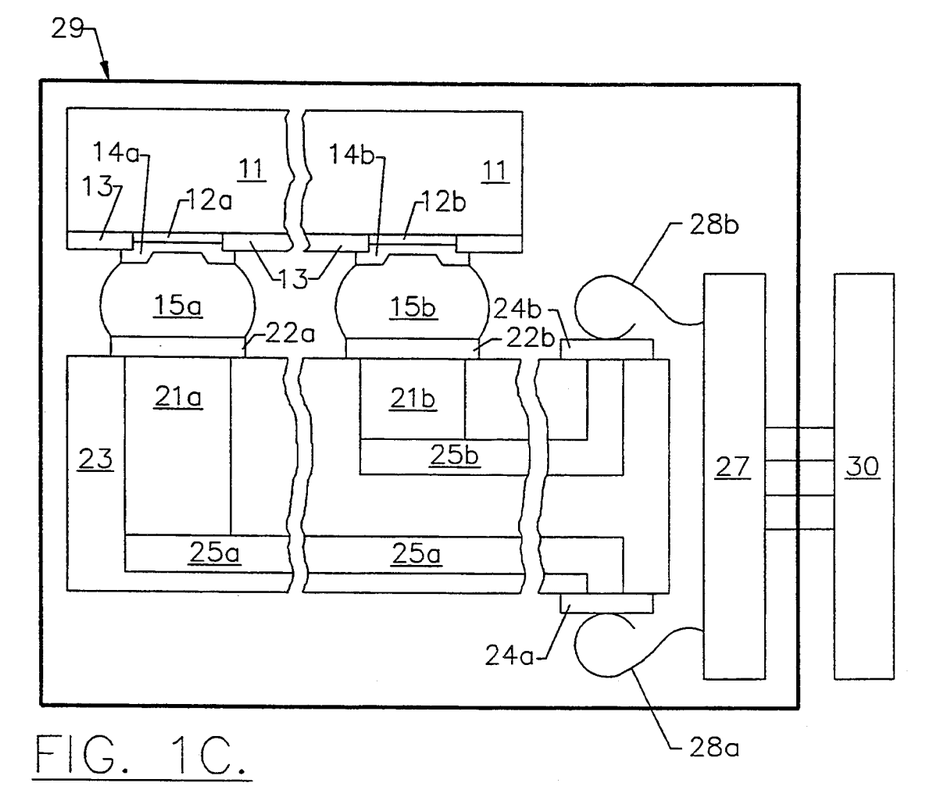

Then, referring to FIG. 1C, the temporary substrate, with the integrated circuit chip joined thereto, is placed in an oven 29, and a standard burn-in and test process may be performed. For example, burn-in and test may take place at 160° C. for 160 hours. During burn-in and test, the sacrificial conductor layer remains in solid phase.

As shown in FIG. 1C, an external connector 27 having fingers 28a and 28b may be used to interface the temporary substrate 20 to a tester 30. It will be understood by those having skill in the art that the external connector 27 will typically have many more fingers than shown in FIG. 1C. The external connector may be implemented using a standard socketable technology such as the "microinterposer" socket marketed by AMP or the "betaflex" connector marketed by Betaphase. Other standard or customized connectors may be used.

It will be understood by those having skill in the art that each chip I/O pad 12 is preferably connected to an individual external connector 24 in an electrically isolated manner, so that tester 30 can test individual chip I/O pads, and the active devices connected thereto, without interference from other pads and the active devices connected thereto. This contrasts with testing of integrated circuit chips when they are already mounted on a next level package, because the next level package typically interconnects various chip I/O pads to one another and to other chips. Accordingly, the temporary substrate of the present invention provides electrical isolation among the individual chip I/O pads to facilitate testing. As is well known to those having skill in the art, the electrical environment is selected to allow full testing (parametric, functional, erasure, programming, burn-in, etc.) at rated device speeds as required. This involves using appropriate dielectric constant insulators, ground planes for noise suppression, and conductors for low attenuation and low inductance power distribution, as required by the particular devices which are to be tested. Likewise, the design of tester 30 will vary relative to the chips being tested and is well known to those having skill in the art. Accordingly, these will not be described in greater detail herein.

Figure 1D:
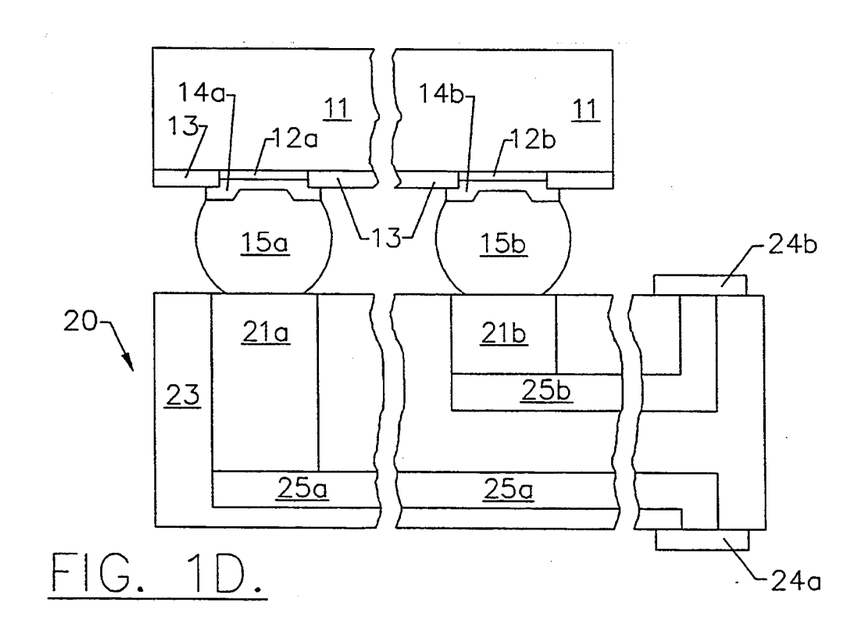
Figure 1E:
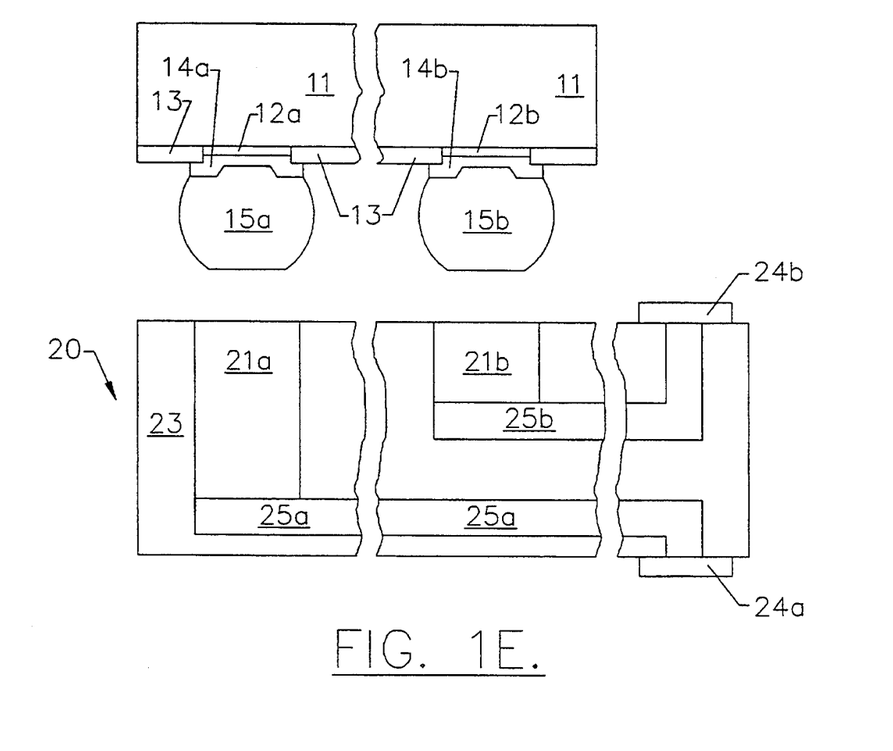

Referring now to FIG. 1D, after testing and burn-in is completed, the chip 11 is separated from the temporary substrate 20 by heating for a sufficient time and temperature to substantially dissolve sacrificial layer 22 into solder bump 15. Since the sacrificial layer is dissolved, the solder bump 15 directly interfaces with the pad 21 to which it is not wettable. Accordingly, upon removal of chip 11, solder bump 15 is fully removed from temporary substrate 20. Solder bump volume is therefore retained after burn-in/test. It will be understood by those having skill in the art that dissolution of a 200 Å copper sacrificial layer may be obtained by heating the 95/5PbSn solder bump for 2-5 minutes at 350° C. after which the chip can be cleaned using standard procedure. As shown in FIG. 1E, a flat may remain on the solder bump 15 so that it appears as a truncated sphere. If desired, a subsequent reflow cycle (e.g. 1 minute above liquidus) may be used to restore the solder bump to spherical shape. The temporary substrate may then be reused by reforming sacrificial conductor layer 22 thereon.

Many techniques will be recognized by those having skill in the art for forming or reforming sacrificial conductor layer 22 on temporary substrate 20. In particular, the substrate may be masked with either an in-situ photoresist mask or an externally applied metal mask. The sacrificial metallurgy, such as about 200 Å copper, may then be evaporated and the mask removed. Other techniques such as sputtering or electroless plating will be well known to those having skill in the art. Alternatively, the sacrificial metallurgy may be plated onto the temporary substrate using the temporary substrate pads 21, interconnection layers 25 and external connectors 24 as a conduction path for plating.

In summary, the temporary substrate with the sacrificial conductor layer thereon allows testing and/or burn-in of a C-4 integrated circuit chip without adversely impacting the volume of the solder bumps thereon. Chips may be burnt-in and tested before application to a next level packaging or before application to a tape automated bonding (TAB) package. The temporary substrate may be reused by reapplying the sacrificial conductor layer thereto. The sacrificial layer may also contain other materials to add these materials to the solder in controlled amounts and change the characteristics thereof. For example, silver can be added for creep resistance.

The temporary substrate can also be used as a mechanism or vehicle for placing solder bumps on an unbumped integrated circuit chip. In other words, the temporary substrate can be used to burn-in and test integrated circuit chips having solder bumps thereon (as shown in FIGS. 1A-1D), and can also be used to place solder bumps on an unbumped chip. A process for using the temporary substrate to apply solder bumps to an unbumped chip will now be described with reference to FIGS. 2A-2E. The rework process would also entail replacing the solder bumps on the temporary substrate.

Figure 2A:
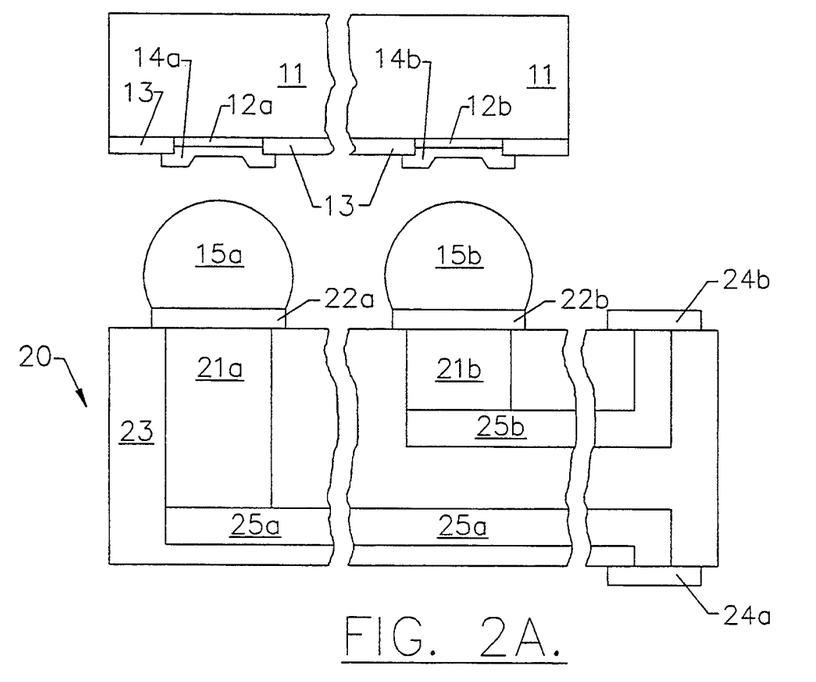
FIGS. 2A-2E are cross-sectional views of the operational steps in a second method for testing an integrated circuit chip according to the present invention.
Figure 2B:
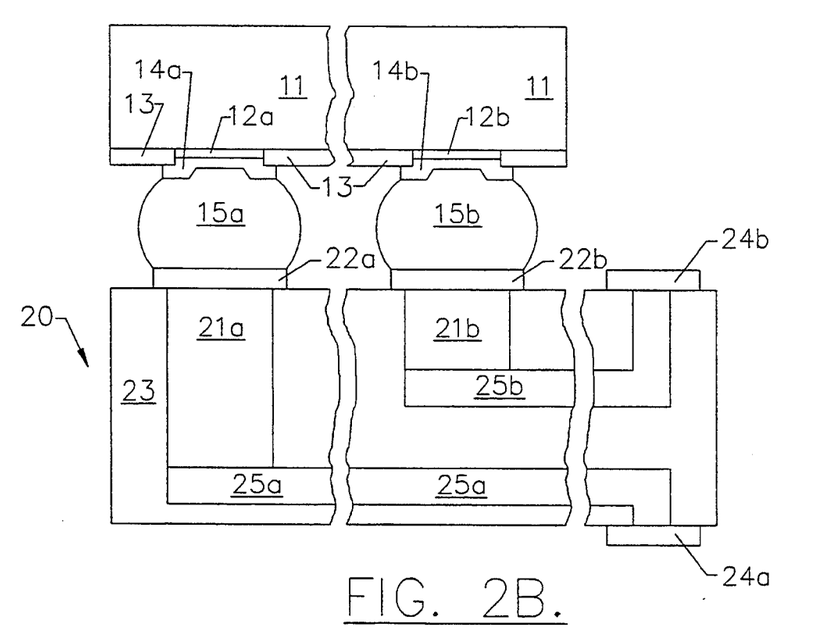
Figure 2C:
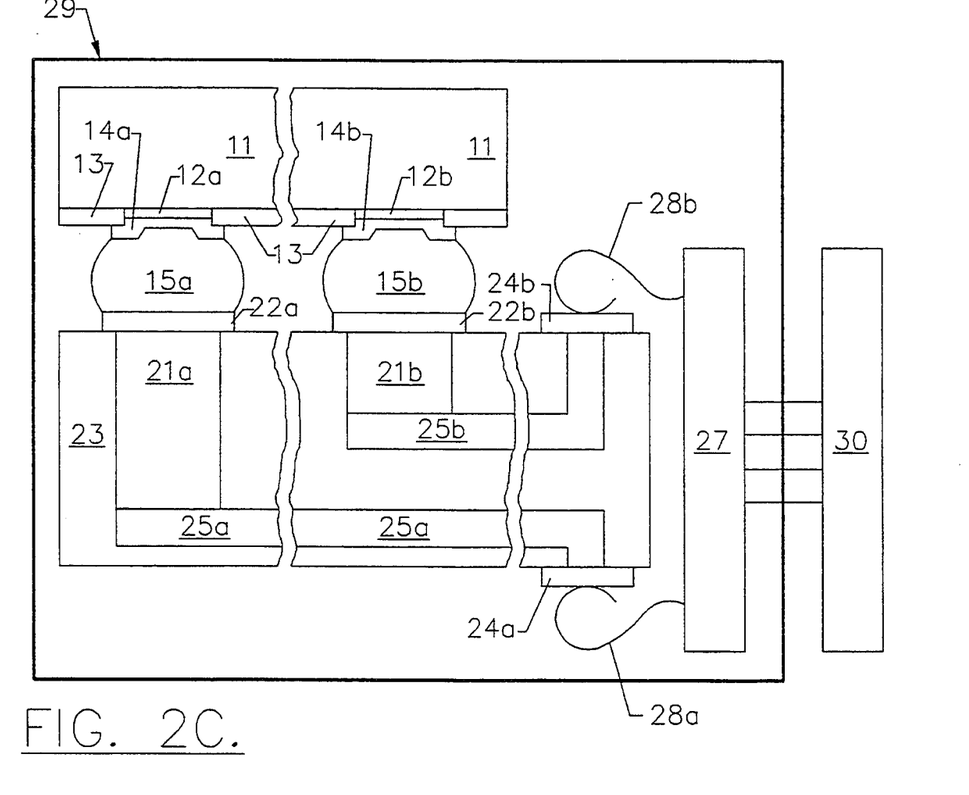
Figure 2D:
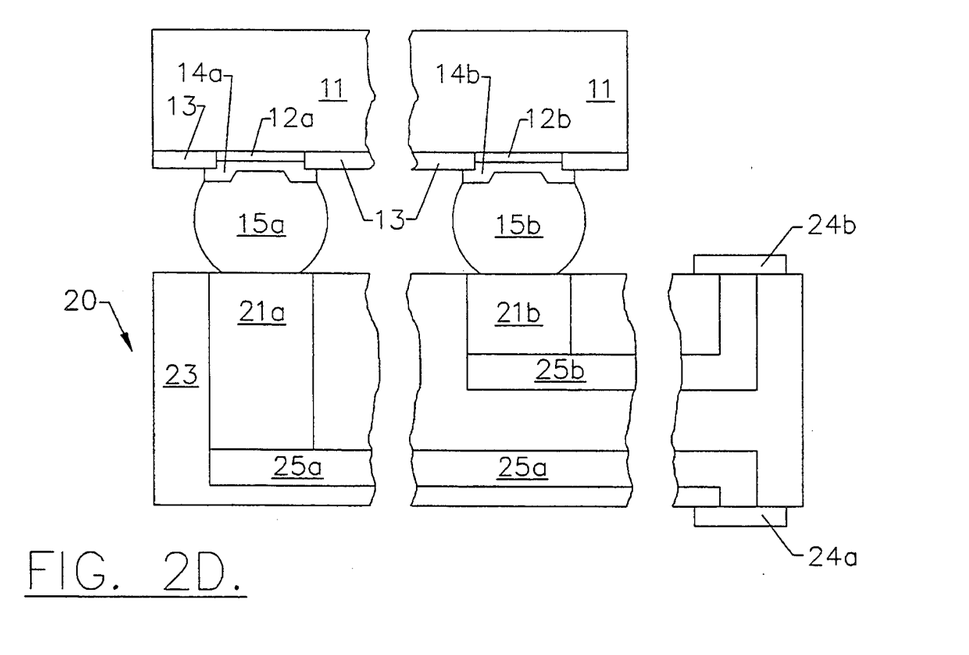
Figure 2E:
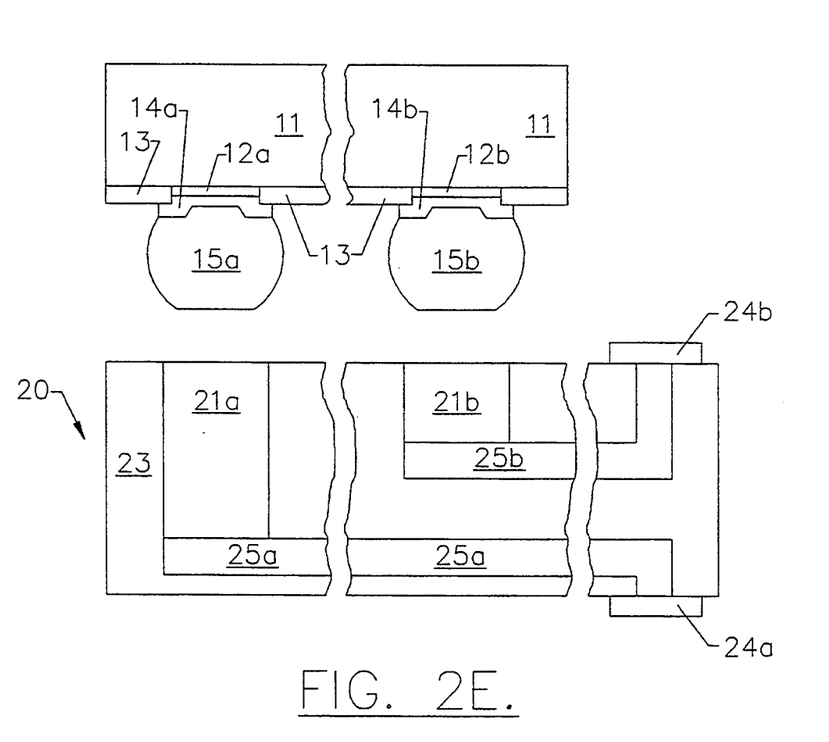

FIG. 2A corresponds to FIG. 1A except the under-bump metallurgy 14 of the integrated circuit 11 does not have a solder bump thereon. Rather, the sacrificial conductor layer 22 of the temporary substrate 20 has solder bumps 15 formed thereon. Once the chip and temporary substrate are brought together and the solder bumps are reflowed, the processing of FIGS. 2B-2E corresponds to the processing already described in FIGS. 1B-1E respectively.

Rework of the temporary substrate involves reforming both the sacrificial conductor layer 22 and the solder bumps 15. Many techniques will be recognized by those skilled in the art for forming or reforming this bump structure. Initial forming and subsequent reforming processes can be similar. The substrate may be masked with either an in-situ photoresist mask or an externally applied metal mask. The sacrificial metallurgy, such as about 200 Å of copper, may be evaporated, followed by evaporation of the solder, and finally, removal of the mask. Alternatively, a blanket plating base such as chromium, copper and chromium layers, is first deposited by evaporation or sputtering. An in-situ photoresist mask is formed and the sacrificial metallurgy layer is deposited and patterned using subetch or lift-off. The solder plating stencil is then fabricated, and the solder is electroplated in the normal fashion. After resist removal, the plating base between the pads 12 is subetched and the solder can be flash heated to reflow the external surface and round the bumps without significantly reacting with the sacrificial layer. Alternatively, one may take advantage of the special wiring on the temporary substrate, wherein each of the contacts 24 are electrically connected to the solder bump contact locations 21. The external pads 24 may be used as contacts to plate the bump structure. This eliminates the need to deposit a plating base, and the subsequent step of subetching the plating base after solder plating.

There is yet another advantage of this method. In particular, since each of the contacts 24 of the temporary substrate is electrically isolated from one another, individual control of the current applied to the contacts may be used to plate solder bumps of differing volumes on the temporary substrate. It has heretofore been desirable to provide different size solder bumps, for example, for power and signal connections, thermal transfer or ultraprecise alignment of optical devices. However, notwithstanding this need, a fully satisfactory process for forming different sized bumps has been heretofore unavailable.

Typically solder bumps are formed on the underbump metallurgy of an integrated circuit chip by plating in galvanostatic mode using a blanket plating base which is deposited on the face of the integrated circuit chip. The blanket plating base is necessary because not all pads on the integrated circuit chip can be electrically contacted. The blanket plating base provides the same current to each pad so that uniform size solder bumps are provided.

In contrast, the temporary substrate allows the current-time product of each individual pad to be individually controlled so that differing current-time products may produce different Volumes of solder bumps. Accordingly, while the solder bumps may be formed on the temporary substrate using conventional evaporation and plating on a blanket plating base, a preferred embodiment of the present invention plates the solder bumps while avoiding the use of a blanket plating base.

Figure 3:
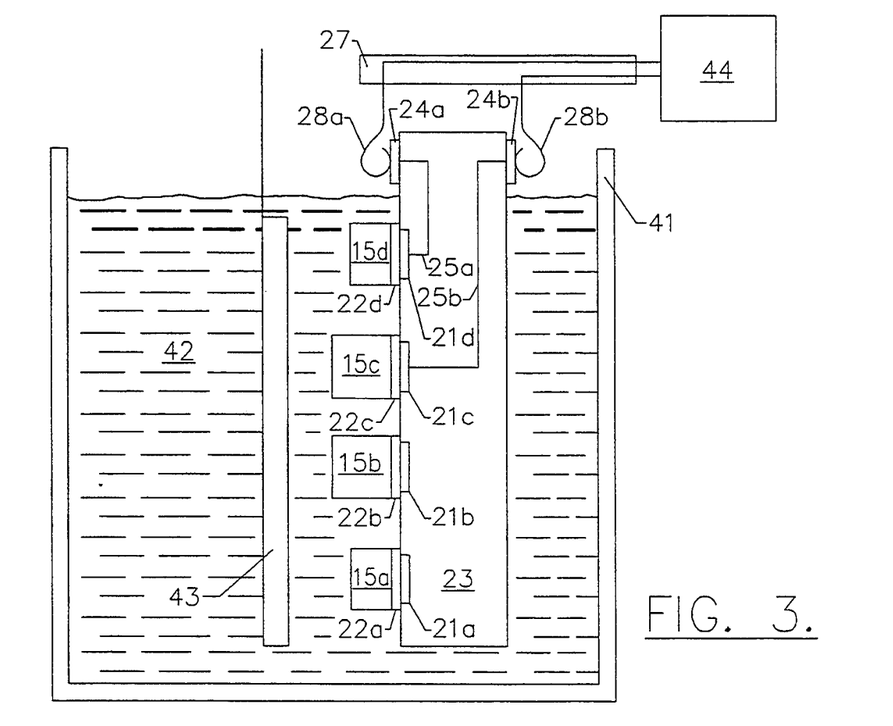
FIG. 3 illustrates a cross-sectional view of a first system for plating solder bumps according to the present invention.
Figure 4:
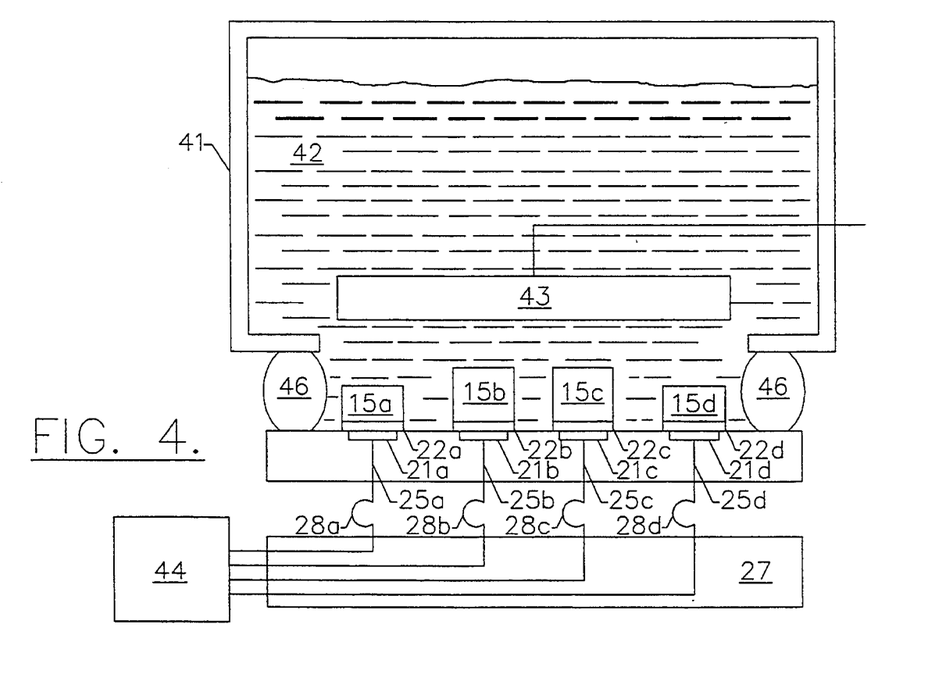
FIG. 4 illustrates a cross-sectional view of a second system for plating solder bumps according to the present invention.

FIGS. 3 and 4 illustrate two embodiments for plating solder bumps without the use of a blanket plating base. As shown in FIGS. 3 and 4, the temporary substrate includes temporary substrate pads 21, interconnection wiring 25, and external contacts 24. The temporary substrate is immersed in plating solution 42 in a plating vessel 41, and placed adjacent a plating anode 43. As shown in FIG. 3, the temporary substrate 23 is dipped in plating solution 42. As shown in FIG. 4, the temporary substrate is placed above the plating vessel 41 and sealed using an o-ring 46 or other known sealing means after which the plating vessel is inverted so that the plating solution is above the temporary substrate 23. In both cases, connector 27 is connected to a plating controller 44 which may provide different current-time values to the different pads to plate different volumes of solder bumps as shown at 15a-15d. When equal volumes are desired, the controller may provide equal current-time product to each connector 28. Alternatively, the connectors 28 may all be shorted together. The design of plating controller 44 is well known to those having skill in the art, and need not be described further herein.

It will also be understood by those having skill in the art that the present invention may also be used to provide different characteristics to the solder balls. For example, only some of the solder balls may be formed in a first plating solution. Then, the remaining solder balls may be formed in a second plating solution to provide solder balls of different composition. Accordingly, characteristics which were heretofore unavailable may be readily achieved using the temporary substrate.

Accordingly, the temporary substrate of the present invention may be used for burn-in and test of bumped chips, and for applying solder bumps to unbumped chips and burn-in/test of these chips. The ability to apply solder bumps to unbumped chips is a particular advantage in the integrated circuit manufacturing industry because many integrated circuit manufacturers do not have the ability to place solder bumps on chips. Accordingly, while many chips may be marketed with solder bumps thereon, other chips are marketed without solder bumps and need to have solder bumps applied thereto for integration into a next level package. The present invention, as illustrated in FIGS. 2A-2E, allows a manufacturer to use both bumped and unbumped chips in the same burn-in/test and packaging process. The present invention also allows solder bumps to be placed on chips without exposing either the chips or next level package to destructive plating channels, subetch bath, cleaning solutions, etc.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming different volume solder bumps on a temporary substrate having a plurality of temporary pads at one face thereof, comprising the steps of:

placing said temporary substrate in a solder plating solution; and applying a first current to a first temporary substrate pad and a second current to a second temporary substrate pad, to thereby form a first volume solder bump in said first temporary substrate pad and a second volume solder bump on said second temporary substrate pad 2. The method of claim 1 further comprising the step of:

transferring said first and second volume solder bumps to first and second input/output pads of an integrated circuit chip, to thereby form an integrated circuit chip having differing volume solder bumps thereon.

3. A method of claim 1 wherein said placing step is preceded by the step of:
forming a sacrificial conductor layer on said temporary substrate pads.

4. The method of claim 1 further comprising the steps of:
placing an integrated circuit chip adjacent said temporary substrate, with the input/output pads thereof adjacent said first and second volume solder bumps;
heating said solder bumps to form a solid phase mechanical and electrical connection between corresponding input/output pads and temporary substrate pads;
testing said integrated circuit chip on said temporary substrate;
dissolving said sacrificial conductor layer into said solder bumps by heating; and
removing said integrated circuit chip, including said first and second volume solder bumps having the dissolved sacrificial conductor layer therein, from said temporary substrate.

5. The method of claim 3 wherein said solder bumps comprise a material which is non-wettable to said temporary substrate pads and wherein said sacrificial conductor layer comprises a material which is dissolvable into said solder bumps and which is wettable to said solder bumps and is adherent to said temporary substrate pads.

6. The method of claim 5 wherein said solder bumps comprise lead-tin solder and said sacrificial conductor layer comprises a copper layer.

7. The method of claim 2 wherein said transferring step is followed by the step of:
mounting said integrated circuit chip on a next level package.

8. The method of claim 5 wherein said solder bumps comprise lead-tin solder and said sacrificial conductor layer comprises a copper layer.

* * * * *